(12) United States Patent
Pierson et al.

(10) Patent No.: US 11,307,136 B2
(45) Date of Patent: Apr. 19, 2022

(54) LIGHT SENSOR AND DECAY-TIME SCANNER

(71) Applicant: SICPA HOLDING SA, Prilly (CH)

(72) Inventors: Frédéric Pierson, Pully (CH); Joël Bonny, Lausanne (CH); Samuel Brügger, Tavannes (CH); Daniel Zahnd, Paudex (CH)

(73) Assignee: SICPA HOLDING SA, Prilly (CH)

( * ) Notice: Subject to any disclaimer, the term of this patent is extended or adjusted under 35 U.S.C. 154(b) by 129 days.

(21) Appl. No.: 16/956,932

(22) PCT Filed: Dec. 13, 2018

(86) PCT No.: PCT/EP2018/084737
§ 371 (c)(1),
(2) Date: Jun. 22, 2020

(87) PCT Pub. No.: WO2019/121315
PCT Pub. Date: Jun. 27, 2019

(65) Prior Publication Data
US 2020/0393365 A1 Dec. 17, 2020

(30) Foreign Application Priority Data
Dec. 22, 2017 (EP) .................................... 17210272

(51) Int. Cl.
*G01N 21/27* (2006.01)
*G06K 19/06* (2006.01)
*G01N 21/31* (2006.01)

(52) U.S. Cl.
CPC ......... *G01N 21/27* (2013.01); *G06K 19/0614* (2013.01); *G06K 19/06112* (2013.01); *G01N 2021/3181* (2013.01)

(58) Field of Classification Search
CPC .......... G01N 21/27; G01N 2021/3181; G06K 19/06112; G06K 19/0614
USPC ........................................................ 235/454
See application file for complete search history.

(56) References Cited

U.S. PATENT DOCUMENTS

| 3,473,027 | A | 10/1969 | Freeman et al. |
| 3,663,813 | A | 5/1972 | Shaw |
| 4,451,521 | A | 5/1984 | Kaule et al. |
| 4,451,530 | A | 5/1984 | Kaule et al. |

(Continued)

FOREIGN PATENT DOCUMENTS

| EP | 0066854 | 4/1985 |
| WO | 2012167894 | 12/2012 |

OTHER PUBLICATIONS

International Search Report along with the Written Opinion and IPRP issued with respect to application No. PCT/EP2018/084737.

*Primary Examiner* — Michael G Lee
*Assistant Examiner* — David Tardif
(74) *Attorney, Agent, or Firm* — Muncy, Geissler, Olds & Lowe, P.C.

(57) ABSTRACT

The disclosed scanner for detecting a decay time of light emitted by a luminescent material has a control unit operable to adapt the drive current, or the value of the drive voltage, powering its light source to accordingly adapt the intensity of excitation light delivered to the luminescent material so that its high sensitivity light sensor can reliably measure the luminescence light emitted in response to the excitation light, and thus accurately determine a corresponding decay time value.

13 Claims, 6 Drawing Sheets

(56) References Cited

U.S. PATENT DOCUMENTS

| | | | |
|---|---|---|---|
| 4,452,843 | A | 6/1984 | Kaule et al. |
| 4,533,244 | A | 8/1985 | Kaule et al. |
| 4,598,205 | A | 7/1986 | Kaule et al. |
| 6,264,107 | B1 | 7/2001 | Thomas, III et al. |
| 6,996,252 | B2 | 2/2006 | Reed et al. |
| 7,213,757 | B2 | 5/2007 | Jones et al. |
| 7,262,420 | B1 | 8/2007 | MacLeod et al. |
| 7,427,030 | B2 | 9/2008 | Jones et al. |
| 9,024,264 | B2 * | 5/2015 | Zhang .................. G01T 1/2985 250/363.03 |
| 9,368,537 | B1 * | 6/2016 | Holmes ............. H01L 27/14681 |
| 2003/0059820 | A1 * | 3/2003 | Vo-Dinh ............... C12Q 1/6837 506/3 |
| 2005/0244096 | A1 * | 11/2005 | Jeffers ................ G01B 9/02007 385/15 |
| 2006/0028260 | A1 | 2/2006 | Baumgartner |
| 2011/0037987 | A1 * | 2/2011 | Gurny .................. G01B 11/026 356/496 |
| 2020/0393365 | A1 * | 12/2020 | Pierson ............. G06K 19/0614 |

\* cited by examiner

LIGHT SENSOR AND DECAY-TIME SCANNER

TECHNICAL FIELD

The present invention relates to the technical field of optical devices for detecting and determining decay time characteristics of luminescence light emitted by a luminescent material. Particularly, the invention relates to optical devices such as (hand-held) optical scanners for authenticating an item comprising a luminescent material on the basis of the decay time characteristics of luminescence light emitted by said material in response to illumination with appropriate excitation light.

BACKGROUND OF THE INVENTION

Luminescent materials are commonly used in security markings to be disposed on documents or articles, or in the bulk material of documents or articles, as an authenticity feature. A luminescent material typically converts energy of an exciting radiation of a given wavelength into emitted light having another wavelength. Luminescence emission used for authentication of a marking can lie in the spectrum range from UV light (below 400 nm), visible light (400-700 nm) or near to mid infrared light (700-2500 nm).

An "up-converter" material emits radiation at a shorter wavelength than the exciting radiation. By contrast, a "down-converter" material emits radiation at a longer wavelength than the exciting radiation. Most luminescent materials can be excited at more than one wavelength, and some luminescent materials can emit simultaneously at more than one wavelength.

Luminescence may be divided in: (i) phosphorescence, which relates to time-delayed radiation emission observable after the excitation radiation is removed (typically, with a decay lifetime from above about 1 µs to about 100 s), and (ii) fluorescence, which relates to prompt radiation emission upon excitation (typically, with a decay lifetime below 1 µs).

Thus, a luminescent material, upon illumination with excitation light within a first wavelength range, typically emits luminescence light within a second wavelength range, which may differ from or overlap with said first wavelength range (depending on the material used). The characteristic spectral properties of a luminescent material such as its emission light intensity profile with time, or its characteristic decay time after excitation has stopped, for example, is a signature of this material and may thus be used as an authenticity feature for detecting genuineness or forgery.

Luminescent materials are classic ingredients of security inks or coatings. For example, the following patents disclose luminescing substances (which may include mixtures of pigments having distinct decay time properties) and security paper including such substances: EP 0 066 854 B1, U.S. Pat. Nos. 4,451,530, 4,452,843, 4,451,521. Processes and apparatuses for detecting luminescence light and authenticity of a marked item are also well known: see, for example, U.S. Pat. No. 4,598,205, or U.S. Pat. No. 4,533,244 (which disclose sensing decay behavior of luminescence emissions). Luminescent coded symbols are known from U.S. Pat. No. 3,473,027, and an optical reader for luminescent codes is disclosed in U.S. Pat. No. 3,663,813. The U.S. Pat. No. 6,996,252 B2, U.S. Pat. No. 7,213,757 B2 and U.S. Pat. No. 7,427,030 B2 disclose using two luminescent materials, having distinct decay time properties, for authenticating an item.

A conventional scanner for detecting time-dependent luminescence light comprises a power source, a light source connected to the power source for illuminating a luminescent material with excitation light, a light sensor for measuring an intensity of the luminescence light emitted by the luminescent material, and a control unit (processor) for controlling the power source, light source and light sensor to acquire an intensity profile with time of the emitted luminescence light, and calculating a decay time value from this intensity profile.

Conventional light sources for such scanners (depending on which part of the spectrum is to be used for detection of the luminescent material) are incandescent lamps (typically for wavelengths between about 400 nm to about 2500 nm) (these lamps are used with mechanical or opto-electronic devices for delivering pulsed light), flash lamps (like Xenon high-pressure flash lamp, for example), laser or Light-Emitting-Diodes (LEDs, emitting in the UV, visible or IR regions, typically for wavelengths from about 250 nm to about 1 micron). Conventional light sources are powered via a drive current (a LED for example) or via drive voltage (discharge lamps, for example).

Conventional light sensors or photodetectors for scanners are photodiodes (single or arrays), phototransistor or photoresistance circuits, linear CMOS or CCD sensors.

Conventional hand-held scanners (either corded or cordless), in addition to their specific power module for supplying the scanner with power, may also comprise a radio module for wireless communication (over Wi-Fi for example), a display module (a liquid crystal display LCD, or kinescope display, for example) for displaying measured data or scanning parameters, and a controlling interface for inputting scan conditions (including buttons having multiple functions and an ON/OFF switch button).

Classically, a decaying intensity curve of luminescence light (intensity profile with time) from a luminescent material is modeled (fitted) by an exponential law $I(t) \approx I_0 \exp(-\alpha[t-t_0])$, wherein time t is counted from instant $t_0$ at which excitation light is removed. Thus, obtaining a value corresponding to the decay rate constant $\alpha$ characterizing the luminescent material necessitates measuring an emission intensity profile, composed of successive intensity values $I(t_1), \ldots, I(t_n)$, over a measuring time interval $\Delta t_{meas}$ after excitation has stopped. In a conventional scanner, a pulsed light source illuminates the luminescent material with an excitation light of a given intensity and in a first wavelength range only during an excitation time interval $\Delta t_{ex}$, then, possibly with a time delay after the illumination has stopped, the light sensor starts measuring successive values of the decaying luminescence light intensity in a second wavelength range over a measuring time interval $\Delta t_{meas}$, and the corresponding luminescence intensity profile I(t) is stored in a memory. The operation may be repeated so as to obtain a plurality of luminescence intensity profiles and calculate more reliable average values. Usually, it is possible to set the excitation time interval and/or the time delay so as to avoid problems with a value of luminescence intensity below a detection threshold value of the light sensor or above its saturation threshold value. However, some other variants are also known.

For example, the U.S. Pat. No. 6,264,107 B1 discloses determining a decay time from the time required for the latent phosphorescence intensity to fall through two predetermined thresholds. This patent discloses a scanner comprising a flood LED (FLED) as a light source, i.e. a very intense light source. Such an intense light source is indeed necessary in this case for charging enough a tag comprising the luminescent material (phosphor) and preventing the problem of low signal response with respect to noise.

In an other approach, the U.S. Pat. No. 7,262,420 B1 discloses carrying out multiple illuminations with excitation light for obtaining a single decay time value: the light source is successively activated (during a same excitation time interval) and a single measure of luminescence intensity is performed after the illumination of the luminescent material with the excitation light source has been switched off, but each successive measurement is performed with a different time delay counted from the time at which excitation light is switched off. However, this method requires one illumination per measured intensity value. Moreover, in order to obtain more reliable results, this method requires repeated measurements corresponding to a same time delay.

In order to obtain a stronger luminescence signal, some scanners allow setting the excitation time interval, so as to "charge" enough the luminescent particles in the luminescent material. Moreover, for a better accuracy of the determined decay time value, a plurality of valid intensity profiles are successively acquired (for example, about a hundred), these curves are then summed and the resulting signal is normalized and the normalized signal is used for calculating the decay time value. An intensity profile is valid if the intensity value of at least the first point of the intensity profile is above a detection threshold of the light sensor and below its saturation threshold (if said value is too low or too high, the excitation time is respectively increased or decreased).

Conventional scanners face serious problems in case of security markings with small quantity of luminescent material or with luminescent material having a weak response to light excitation, particularly for short decay times (for example from about 100 µs to few ms). In order to be able to detect resulting low level luminescence intensity signals it is necessary to increase the sensitivity of the scanner, as merely increasing excitation time is generally not sufficient to solve this issue: for example, due to the amount of heat generated when using long excitation light pulses, it is necessary to increase a separation between the illumination light source and the luminescent material by using a light guide between the light source and an illuminated surface of the luminescent material, a central hollow portion of the light guide serving to collect the resulting luminescence emission light back toward the light sensor. However, using a light guide to collect emission light causes luminescence light intensity losses and thus, does not appear convenient for detecting low level light intensity signals. Trying to increase sensitivity of the scanner by bringing the light sensor closer to the luminescent material to avoid such luminescence intensity losses also causes problems: as a high illumination intensity level is necessary to cause luminescence emission response of sufficient intensity (i.e. above detection threshold level of the light sensor), the light sensor is generally saturated and the resulting "blind time" necessary to recover (i.e. to accurately measure a luminescence intensity below the saturation level of the light sensor) at least necessitates having a (quite long) time delay after the end of illumination before starting of measurements of luminescence light intensity. However, due to the fast decreasing signal of the luminescence light intensity response to excitation illumination, such a time delay between the end of illumination and start of luminescence light detection causes that a part of the highest luminescence intensity signal cannot be used for determining a decay time value. Only a low level part of the luminescence light intensity signal can be measured but with lower accuracy, particularly in case of weak luminescence signal.

Also, in case the light sensor is disposed very close to a surface of the marking comprising the luminescent material (for example about few millimeters or less), the powerful excitation illumination that must be delivered to the marking (for example, with a FLED, "Flash LED) more easily saturates the photodiode. Such a situation contributes to increase the overall recovering time of the photodiode, and may also cause excessive level of current to flow in the circuitry (with corresponding possible damages). Thus, in case of powerful illumination in conventional readers, a light guide is disposed between the light source and the marking so as to palliate these drawbacks, but with the above mentioned inconvenience of lowering the sensitivity of the optical sensor (as less luminescence light is detected). The additional problem due to the light guide is that even more illumination light is necessary, with the inconvenience of power consumption and heat dissipation. However, in case no light guide is used between the light source and the luminescent marking, the above mentioned saturation effect, practically precludes accurate detection of a luminescence intensity profile due to excessive blind time (typically 80-100 µs or more) before the light sensor recovers (i.e. goes back to unsaturated state).

Increasing the measuring time is clearly also not a solution, as only the part of the luminescence intensity signal emitted shortly after the end of excitation by illumination light is in fact relevant for determining the decay time characteristics (i.e. when emission intensity signal is strong enough to be detected by the light sensor with good accuracy). This is particularly the case when trying to measure short decay time values from weak emission signal ("short" meaning a value of less than about 100 µs).

Thus, there still a need for a high sensitivity scanner capable to detect weak luminescence light intensity signals from a luminescent material of a marking and acquire corresponding luminescence intensity profile to accurately calculate decay time characteristics, and nevertheless operable to deliver high excitation light intensities to the luminescent material while practically eliminating light losses during illumination of the marking and luminescence light collection.

SUMMARY OF THE INVENTION

The present invention is aimed at providing a high sensitivity light sensor and a scanner incorporating said light sensor, particularly a compact hand-held optical scanner, operable to detect weak luminescence light intensity signals for accurately determining corresponding decay time of a luminescent material that avoids the above mentioned drawbacks of the prior art.

According to one aspect of the invention, a light sensor for detecting luminescence light received from a luminescent material, comprises:

a bias regulator operable to deliver a bias voltage $V_b$;
  a photodiode having a cathode connected to the bias regulator so that the photodiode is reversely biased by the delivered bias voltage $V_b$, the photodiode being operable to deliver, in a photoconductive mode, a photocurrent intensity $I_p$ in response to received luminescence light in a given photodiode spectral range;
  an inverting transimpedance amplifier including an operational amplifier with a feedback resistor $R_f$ and a feedback capacitor $C_f$ mounted in parallel with the feedback resistor $R_f$ between an inverting input terminal and an output voltage terminal of the operational amplifier, the inverting input terminal of the operational amplifier being connected to an anode of the photodiode and operable to convert the delivered photocurrent intensity $I_p$ into an output voltage signal $V_{out}$ at the output voltage terminal;

the light sensor further comprising a PNP bipolar junction transistor of which emitter E and base B are connected in parallel with said feedback resistor $R_f$ and feedback capacitor $C_f$, with its base B connected to said output voltage terminal and its collector C grounded.

The bias regulator of the light sensor is preferably is a low noise, fast transient response bias regulator.

The light sensor may further comprise capacitors $C_1$ and $C_2$ in series connected to the cathode of the photodiode and grounded, and a grounded resistor $R_g$ connected to a non-inverting output terminal of the operational amplifier and a terminal between the capacitors $C_1$ and $C_2$, that are adapted to eliminate voltage variations caused by the bias regulator.

The light sensor may further comprise a bias current sensor, connected between an output voltage terminal of the bias regulator and the cathode of the photodiode, operable to measure an intensity of the bias current $I_{bias}$ delivered to the photodiode.

According to another aspect of the invention, a scanner for detecting luminescence light from a luminescent material upon illumination with an excitation light within an excitation wavelength range, said luminescent material emitting said luminescence light within an emission wavelength range, comprises:

a power source operable to deliver variable drive current or drive voltage; and a light source connected to said power source and operable to illuminate said luminescent material with said excitation light within said excitation wavelength range when powered with the drive current or the drive voltage delivered by the power source, during an excitation time interval $\Delta t_{ex}$, said light source being operable to produce said excitation light with an excitation light intensity varying according to the delivered drive current or drive voltage, said scanner further comprising the above mentioned light sensor equipped with said bias current sensor operable to deliver the output voltage signal $V_{out}$ to an input terminal of an analog-to-digital signal converter connected to the output voltage terminal upon illumination of said luminescent material with said light source and detection of corresponding emitted luminescence light, the analog-to-digital signal converter being operable to convert the output voltage signal $V_{out}$ into a digitalized luminescence light intensity signal over a measuring time interval $\Delta t_{meas}$; and a control unit connected to the bias current sensor to receive a measured value of the intensity of the bias current $I_{bias}$ and further connected to a control bus, the control unit being operable to control the power source via a first digital-to-analog signal converter connected between the power source and the control bus by setting a value of the drive current or drive voltage and a value of the excitation time interval $\Delta t_{ex}$, and the light sensor via both the analog-to-digital signal converter, further connected to the control bus, and a second digital-to-analog signal converter, connected to an offset resistor $R_o$ connected to the anode of the photodiode and further connected to the control bus to convert an offset current intensity $I_o$ into a digitalized offset current intensity, to set a value of the measuring time interval $\Delta t_{meas}$ and acquire the luminescence light intensity signal over the value of the measuring time interval $\Delta t_{meas}$ to form a digitalized luminescence light intensity signal profile I(t), wherein said control unit is further operable to receive said luminescence light intensity signal and control said power source to adapt the value of the drive current, or the value of the drive voltage, delivered to the light source so that a luminescence light intensity value corresponding to a delivered luminescence light intensity signal is below a maximum intensity value $I_{max}$ corresponding to a saturation threshold value of the photodiode.

The control unit of the scanner according to the invention, may be further operable, based on the measured value of intensity of the bias current $I_{bias}$, to adapt the value of the drive current, or the value of the drive voltage, delivered to the light source so that a level of the corresponding current intensity in the photodiode is below a photodiode current intensity threshold value and the level of the corresponding current intensity through the PNP bipolar junction transistor is below a transistor current intensity threshold value.

Moreover, in an embodiment of the scanner according to the invention, the control unit may further be operable, based on the measured value of intensity of the bias current $I_{bias}$, a received value of the digitalized offset current intensity $I_o$, and a received value of the digitalized luminescence light intensity signal, to set a value of the delivered offset current intensity $I_o$ via the second digital-to-analog signal converter. The scanner may further have the control unit operable to switch off the light source and then acquire digitalized luminescence light intensity signal and set a value of the offset current so as to make the acquired digitalized luminescence light intensity signal close to zero, thereby compensating a current intensity due to stray light. The scanner may also have the control unit further operable to power the light source and then form a digitalized luminescence light intensity signal profile I(t), check if a value of a digitalized luminescence light intensity signal acquired after the measuring time interval $\Delta t_{meas}$ is close to zero, and, in case said checked value is not close to zero, further set a value of the offset current to make a value of a digitalized luminescence light intensity signal further acquired after the measuring time interval $\Delta t_{meas}$ close to zero, and then control the scanner to illuminate the luminescent material during the excitation time interval $\Delta t_{ex}$, acquire at least one corresponding digitalized luminescence light intensity signal profile I(t) over the measuring time interval $\Delta t_{meas}$ and store in a memory each acquired digitalized luminescence light intensity signal profile. Preferably, the scanner may have its control unit further operable to determine a value of a decay time of the luminescent material from a stored digitalized luminescence light intensity signal profile. Moreover, the control unit may further be operable to decide that the luminescent material is genuine in case the determined decay time value matches a reference value of decay time.

In any one of the above mentioned variants of embodiment of a scanner according to the invention, the illumination light source may comprise a flat LED, the photodiode may be a flat photodiode and said flat LED and flat photodiode may be mounted adjacent and wired on a flat support member of a nose piece of the scanner for illuminating the luminescent material and collecting corresponding luminescence light, thereby allowing the nose piece to be disposed close to the luminescent material to improve illumination and luminescence light collection efficiency without necessitating a light guide. Preferably, the scanner, has its illumination light source comprising a plurality of flat LEDs wired in series on the support member, and a plurality of flat photodiodes wired in parallel on the support member.

Furthermore, in a scanner according to the invention, the setting of the intensity of excitation light by means of the drive current intensity, or the value of the drive voltage (depending on power supply adapted to the light source), so that the detected luminescence signal is acceptable (i.e. is within the range of reliable operation of the light sensor), allows both obtaining reliable luminescence intensities and having the same excitation time for each luminescence intensity profile, and thus a plurality of intensity profiles corresponding to a same excitation time may be used for obtaining a (possibly normalized) profile having better accuracy.

The luminescence intensity value may be judged acceptable by the control unit if it is within a given range of luminescence intensity values. For example, the luminescence intensity value may be above a detection threshold of the light sensor, and below a saturation threshold of the light sensor, i.e. within a reliable detection range of the light sensor. The range of luminescence intensity values may also ensure that a signal to noise ratio of a measured luminescence intensity is above a threshold value and the light sensor does not saturate during corresponding measurement operation.

The present invention will be described more fully hereinafter with reference to the accompanying drawings in which like numerals represent like elements throughout the different figures, and in which prominent aspects and features of the invention are illustrated.

DETAILED DESCRIPTION

In order to obtain a high sensitivity light sensor capable to detect weak luminescence light intensity signals from a luminescent material of a marking (to allow acquiring luminescence intensity profile I(t) and accurately calculating a decay time characteristic of the luminescent material from the profile), a specific electronic circuitry has been developed that makes possible a fast recovering (i.e. desaturation) of a high sensitive photodiode of the light sensor shortly after a powerful illumination with excitation light has been delivered to the marking so that accurate detection of luminescence light intensity signal emitted by the luminescent material of the marking in response to this excitation can start very soon after the end of illumination, while the (weak and decreasing) luminescence intensity signal is still close to the maximum of emission intensity (i.e. immediately after the end of illumination pulse), even in case the photodiode is disposed very close to an emitting surface of the luminescent material.

Figure 1:
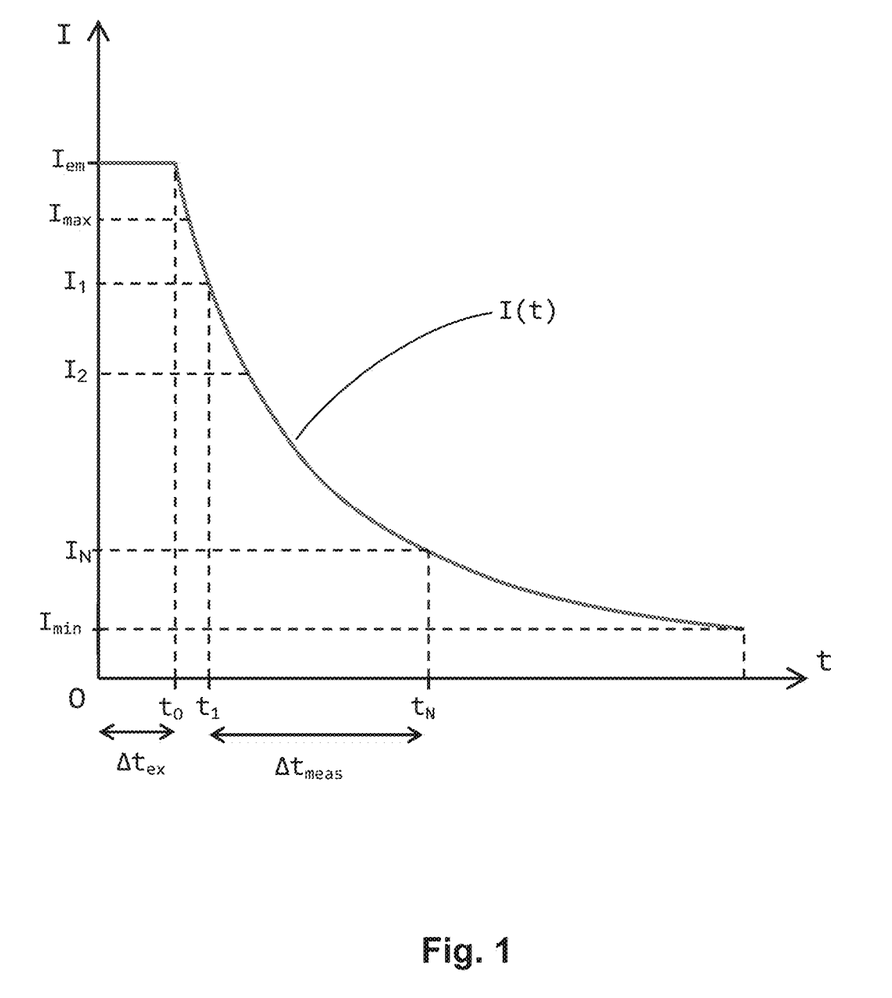
FIG. 1 is an illustration of a typical shape of a luminescence light intensity signal received from a luminescent material in response to excitation illumination.
Figure 7:
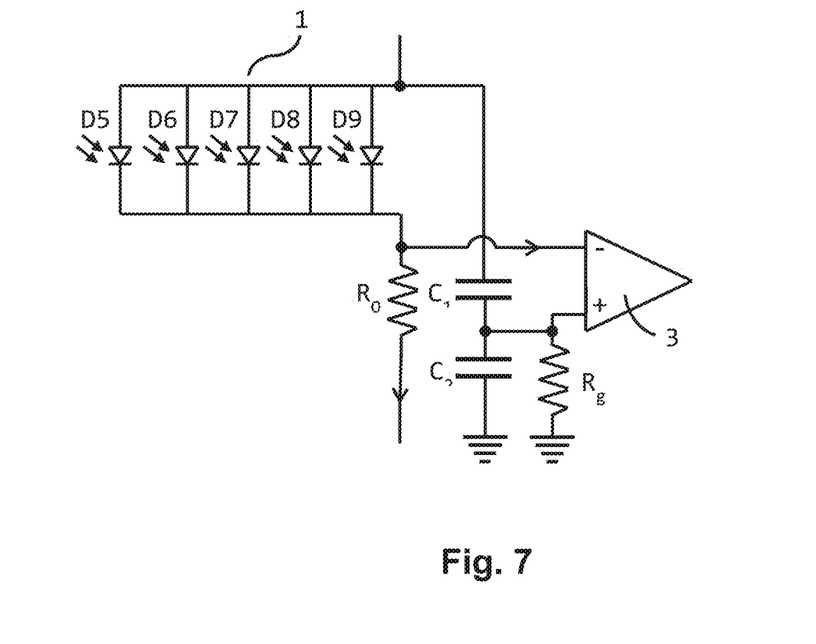
FIG. 7 illustrates the electrical circuit scheme of the light sensor of FIG. 5.

FIG. 1 shows a typical shape of a luminescence light intensity signal from a luminescent material in response to excitation illumination. A powerful pulse of excitation light (with wavelength spectrum within an excitation wavelength range, for example by means of a FLED, "Flood LED") first illuminates a marking comprising a luminescent material during an excitation time interval $\Delta t_{ex}$ and then, in response, the luminescent material emits luminescence light (within an emission wavelength range) with an intensity reaching a maximum value $I_{em}$ at the end of illumination at instant $t_0$. Due to the powerful illumination, this value $I_{em}$ is generally above a maximum intensity value $I_{max}$ corresponding to a saturation threshold value of a photodiode of a light sensor used to detect the luminescence light emission. Typically, the emitted luminescence light intensity signal $I_L$ over time can be fitted by a decreasing exponential curve $I_L=I_{em}\exp(-(t-t_0)/\tau)$, with $\tau$ being a decay time value that is characteristic of the specific luminescent material considered. Generally, the photodiode starts accurately detecting the luminescence intensity signal only from an instant $t_1$ after the end of illumination at $t_0$, once being in an unsaturated state, to detect a corresponding value $I_1$ of the emitted luminescence light intensity and continues detecting luminescence light intensities $I_2(t_2), \ldots, I_N(t_N)$ at respective subsequent instants $t_2, \ldots, t_N$ during a measuring time interval $\Delta t_{meas}$ before the emitted decreasing luminescence light intensity falls below a minimum intensity value $I_{min}$ (close to zero) corresponding to a noise threshold value of the photodiode (below which measured intensity values are not accurate enough). For example, to illustrate the meaning of the expression "close to zero", the light sensor with the five photodiodes D5-D9 shown on FIGS. 5 and 7, a typical value of the minimum intensity $I_{min}$ is about five times the dark current intensity, i.e. about 5×5 nA=25 nA for a reverse (bias) voltage of about 20 V. Thus, the measured luminescence light intensity values $I_1(t_1), \ldots, I_N(t_N)$ can be used to determine (via curve fitting or interpolation methods) a luminescence light intensity profile I(t) from which a value of the characteristic decay time parameter $\tau$ can be determined (as well known in the art). In practice, in order to obtain a more reliable statistical (average) value for $\tau$, the illumination-detection cycle is repeated a certain number of times to acquire a plurality of luminescence light intensity profiles. As an example, we mention a luminescent material that can be excited with illumination light in the infrared (IR) wavelength range (i.e. comprized between about 700 nm and 1 mm, for example around 900 nm), with illumination pulses corresponding to an excitation time interval $\Delta t_{ex}$ of about 100 µs, and emitting luminescence light in the infrared (IR) range (for example around 900 nm) with a measuring time interval $\Delta t_{meas}$ of several milliseconds (for example, about 4 ms). The emitted IR luminescence light, depending on the luminescent material, has a decay time characteristic τ (decay time constant) which can range between about few μs and few ms (for example, between 15 μs and 10 ms).

Figure 2:
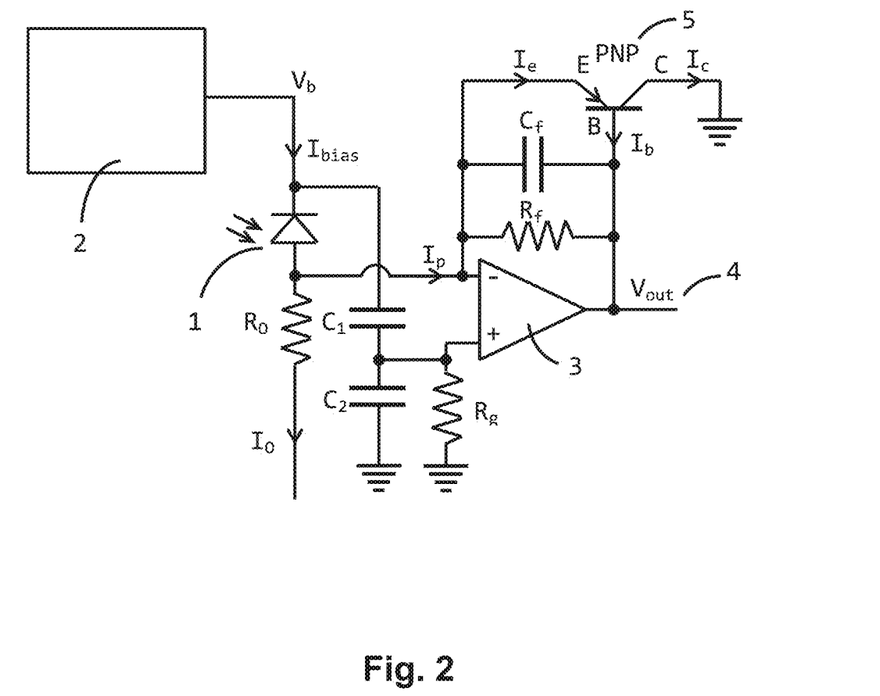
FIG. 2 is a schematic illustration of an electrical circuitry of a light sensor for detecting luminescence light from a luminescent material according to an embodiment of the invention.

To obtain the above mentioned high sensitivity fast recovering light sensor, illustrated on FIG. 2 with only one photodiode (1), the photodiode module comprises the photodiode (1) mounted to operate in the photoconductive mode (i.e. a reversely biased photodiode) with a positive high voltage $V_b$ applied at its cathode by means of a low noise, fast transient response bias regulator (2), and an inverting transimpedance amplifier including an operational amplifier (3) of which inverting input terminal is connected to the anode of the photodiode (1) and non-inverting input terminal is grounded. The inverting transimpedance amplifier also comprises a feedback resistor $R_f$ and a feedback capacitor $C_f$ (here, $R_f$ and $C_f$ respectively designate both the resistor element and its resistance value, and the capacitor element and its capacitance value), in parallel with the feedback resistor $R_f$, connected between the inverting input terminal and the output voltage terminal (4) of the operational amplifier (3). The reverse bias increases the width of the depletion layer of the p-n junction of the photodiode, with the consequence that the capacitance of the junction is lowered and the response time is reduced (high-frequency performance is thus improved).

The feedback resistor $R_f$ is for setting the (high) gain of the inverting transimpedance amplifier, and the (small value) feedback capacitor $C_f$ is for improving stability. When illuminated with luminescence light, the photodiode (1) delivers a photocurrent intensity $I_p$ to the operational amplifier (3) which delivers a corresponding output voltage $V_{out}$ at the output terminal (4). According to the invention, in order to drastically reduce the overall recovering time of the photodiode (1), even in case the photodiode is disposed close to the surface of the luminescent material (the operational amplifier being then not capable to evacuate all the current), a PNP bipolar junction transistor (5) is further connected in parallel between the feedback resistor and feedback capacitor, with its collector C connected to the ground to evacuate the surge current which appears when the photodiode delivers a strong current and saturates as the output photo-voltage approaches the reverse bias voltage $V_b$, and thus allows shortening the desaturation time of the light sensor (the PNP "assists" the operational amplifier in evacuating the current). Connecting the collector C to the ground also reduces the ringing effect caused by disturbance of the power supply of the operational amplifier (not shown) due to the photocurrent variation when the illumination pulse stops. For example, a voltage regulator (not shown) supplying the operational amplifier (3) and the transistor (5) typically generates a huge current of about 500 mA, and causes ringing. The emitter E and base B of the transistor (5) are connected in parallel with the feedback resistor $R_f$ and the feedback capacitor $C_f$, the base B being connected to the output terminal (4). As indicated, the gain of the operational amplifier is set by the value of the feedback resistor $R_f$, but it is also the dominant source of noise (ringing effect). By connecting the collector C to the ground, the bias regulator is not perturbed and the ringing effect is strongly reduced. This configuration is particularly convenient for photodiodes illuminated with low light intensity levels requiring a high gain (large value of $R_f$). As a result of this circuit configuration, fast switching speed compatible with the illumination-measurement cycles is allowed, shorter decay time characteristics can be obtained from the measured luminescence light intensity (as intensity is detected earlier), weak intensity signal due to a lower quantity of luminescent material in the marking can be detected (as the signal has not decayed too much when the photodiode starts detecting) and sensitivity of the light sensor is accordingly increased. Moreover, increasing the excitation pulse intensity delivered to the luminescent material (for detecting luminescence emission level due to reduced amount of luminescence material) generates a strong photocurrent delivered by the photodiode (1). However, the photodiode saturates when the output photovoltage approaches the reverse bias voltage $V_b$, and the saturation of the operational amplifier can be avoided by evacuating the surge current in the photodiode through the ground (thanks to the PNP transistor which drains the surge current).

Preferably, in order to eliminate voltage variations due to the bias regulator (2) (trying to maintaining the bias voltage at the value $V_b$ over the illumination-measurement cycles), two capacitors $C_1$ and $C_2$ are mounted in series and connected between the anode of the photodiode (1) and the ground (to block the AC variations of bias current $I_{bias}$ resulting from bias voltage variations due to the pulse) and a grounded resistor $R_g$ is connected between the non-inverting input terminal of the operational amplifier (3) and a terminal between the two capacitors $C_1$ and $C_2$. Moreover, a resistor $R_o$ may further be connected to the anode of the photodiode (1) and set to absorb offset current and shift down the measured offset current intensity $I_o$ to some reliable range.

Figure 3:
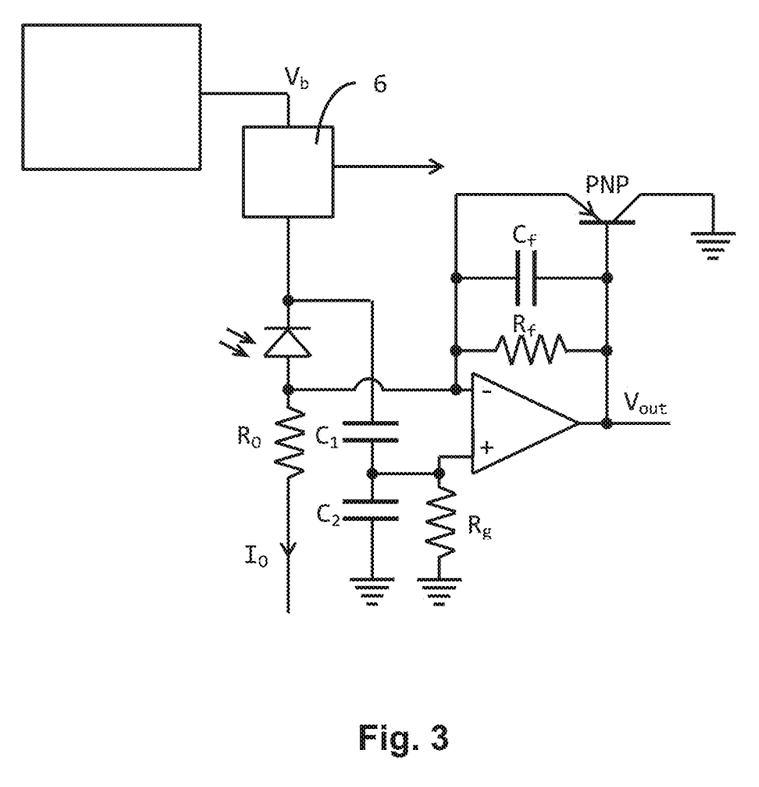
FIG. 3 is a schematic illustration of the electrical circuit of the light sensor of FIG. 2, with further connection to a bias current sensor, according to the invention.

As shown on FIG. 3, the light sensor may also comprise a bias current sensor (6), connected between the output voltage terminal $V_b$ of the bias regulator (2) and the anode of the photodiode, for measuring an intensity of the bias current $I_{bias}$ delivered to the photodiode (1). Such a bias current sensor is necessary for controlling the level of current intensity in the photodiode (1) and avoid damaging it (this current intensity can reach high values, for example 300 mA or even higher), by limiting the level of excitation illumination.

Figure 4:
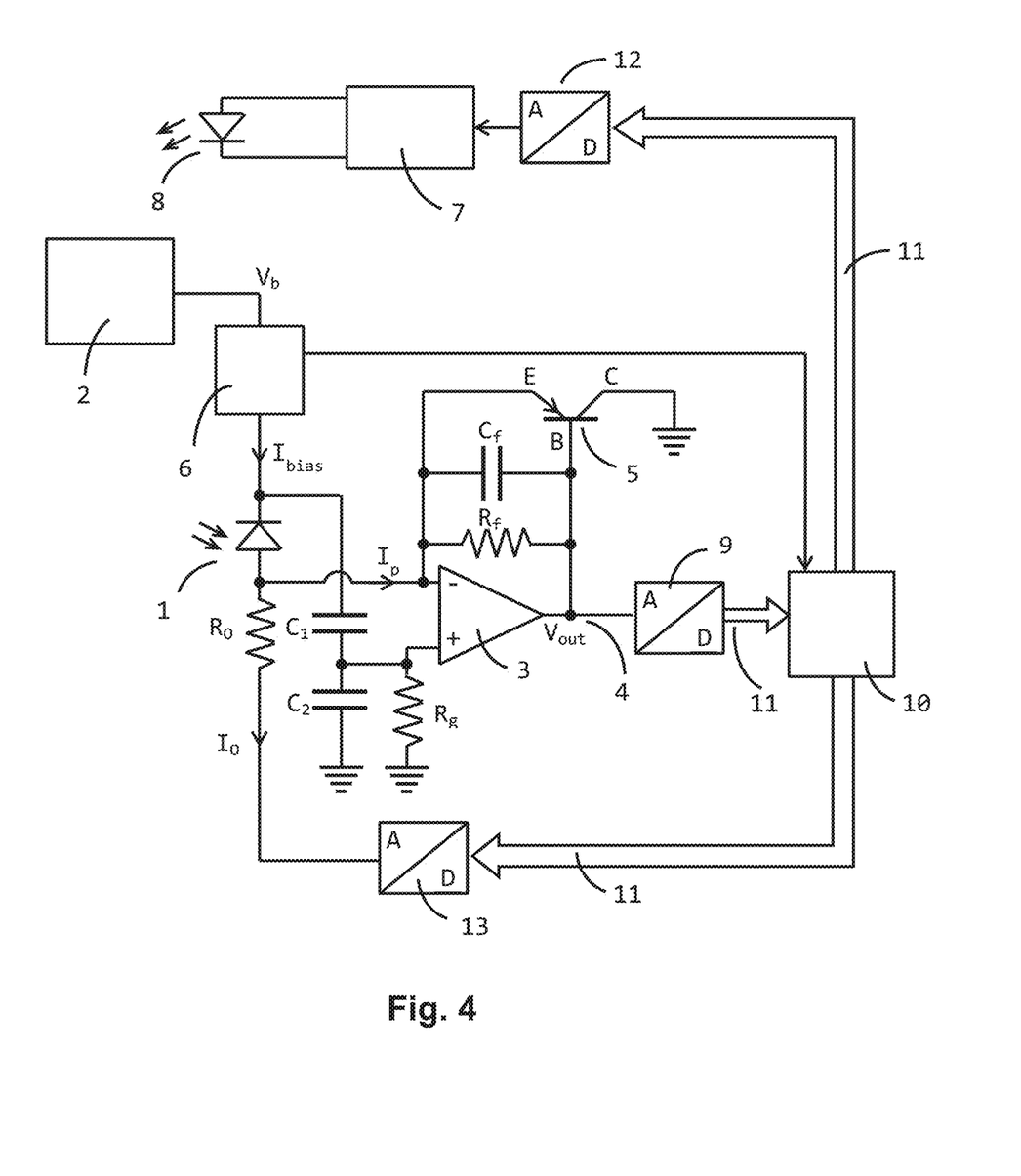
FIG. 4 illustrates an electrical circuit scheme of a scanner according to the invention, incorporating the light sensor of FIG. 3.

FIG. 4 shows an electrical circuit scheme of a scanner according to the invention, incorporating the light sensor shown on FIG. 3. The scanner comprises a power source (7) for delivering variable drive current or drive voltage to a light source (8). This light source (8) can illuminate a luminescent material (not shown) with an excitation light within an excitation wavelength range (adapted to the luminescent material) when powered by the power source (7), during an excitation time interval $\Delta t_{ex}$, the light source (8) being operable to illuminate the luminescent material with said excitation light having an excitation light intensity varying according to the drive current or drive voltage delivered by the power source (7).

The scanner further incorporates the light sensor of FIG. 3, which, upon illumination of the luminescent material with the light source (8) and detection of corresponding emitted luminescence light by the photodiode (1), is operable to deliver the output voltage signal $V_{out}$ to an input terminal of an ADC (9) ("analog-to-digital signal converter") connected to the output voltage terminal (4). This ADC (9) converting the output voltage signal $V_{out}$, received over a measuring time interval $\Delta t_{meas}$ into a corresponding digitalized luminescence light intensity signal.

The scanner further comprises a control unit (10) connected to the bias current sensor (6) to receive a measured value of the intensity of the bias current $I_{bias}$ and is also connected to a control bus (11).

The control unit (10) controls the power source (7) by means of a first DAC (12) ("digital-to-analog signal converter"), connected between the power source (7) and the control bus (11), by setting a value of the drive current or drive voltage and a value of the excitation time interval $\Delta t_{ex}$. The control unit (10) also controls the light sensor by means of both the ADC (9), further connected to the control bus (11), and a second DAC (13), connected to the offset resistor $R_o$ connected to the anode of the photodiode (1) and further connected to the control bus (11), to convert the offset current intensity $I_o$ into a digitalized offset current intensity, to set a value of the measuring time interval $\Delta t_{meas}$ and acquire the luminescence light intensity signal over the value of the measuring time interval $\Delta t_{meas}$, and to form a digitalized luminescence light intensity signal profile I(t).

The control unit (10) is further operable to control the power source (7) to adapt the value of the drive current, or the value of the drive voltage, delivered to the light source (8), based on the received luminescence light intensity signal, so that the luminescence light intensity value corresponding to the received luminescence light intensity signal is below a maximum intensity value $I_{max}$ corresponding to a saturation threshold value of the photodiode (1) and of the operational amplifier (3).

Figure 5:
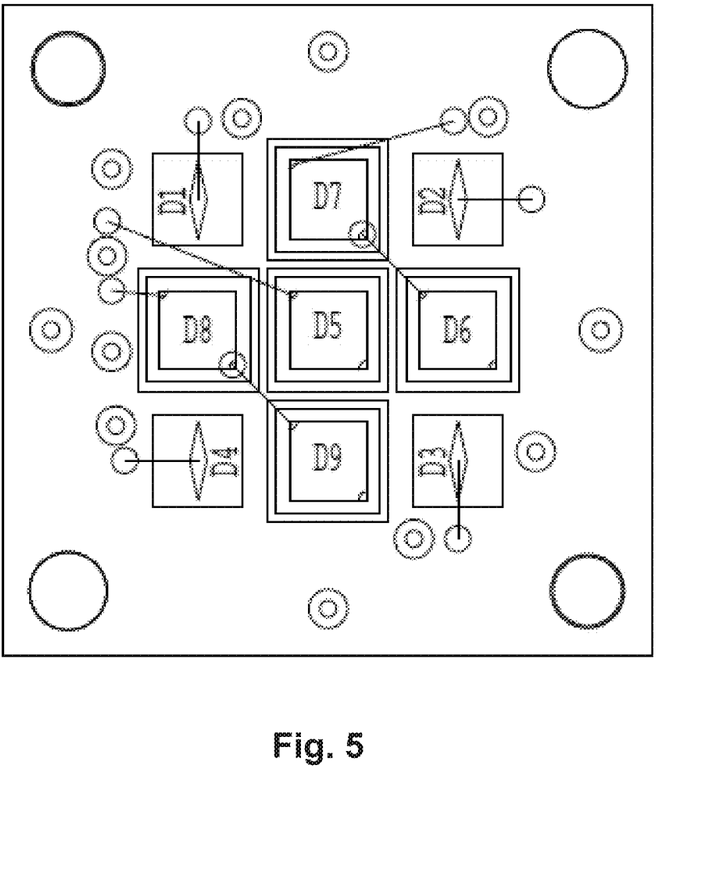
FIG. 5 illustrates a compact scanner nose piece integrating a light source with flat LEDs and a light sensor with flat photodiodes, according to an embodiment of the invention.
Figure 6:
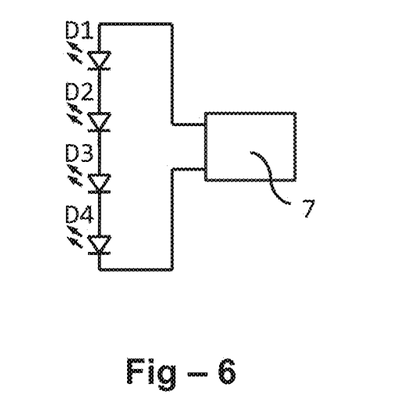
FIG. 6 illustrates the electrical circuit scheme of the light source of FIG. 5.

FIG. 5 shows a view of compact scanner nose piece, having a square shape of dimensions 8×8 mm, wherein a light source with four flat LEDs D1 to D4 wired in series, and a light sensor with five flat photodiodes D5 to D9 (here, fast response photodiodes) wired in parallel are integrated on a flat support (they are glued to the support), according to an embodiment of the invention. This wiring in parallel allows reaching a high sensitivity level for light detection. Here, the photodiodes have a spectral range of sensitivity of 750 nm to 1100 nm, a radiant sensitive area of 1 mm², a rise and fall time of 5 ns, a capacitance of 11 pF, the spectral sensitivity of the chip being 0.65 A/W at wavelength $\lambda$=870 nm, with dark current of 1 nA and reverse voltage of 20 V. Such a compact nose allows positioning the LEDs and the photodiodes very close to the surface of a marking including the luminescent material, thus avoiding any light guide and corresponding losses while minimizing stray light. For example, this nose illumination-detection head allows measuring luminescence light intensity signals every 200 ns and typically acquire 30 to 40 values over a measuring time interval $\Delta t_{meas}$.

As an example, a measurement cycle comprises the following steps:
- a preliminary step for setting the offset (via the DAC (13)), wherein the light sensor of the scanner detects light for acquiring an intensity profile I(t) without excitation illumination by the light source (8). This allows eliminating the component of the photocurrent intensity signal due to stray light.
- illumination light pulses are delivered by the light source (8) which serve to set the amplitude of the pulses so that the detected maximum photocurrent intensity ($I_{em}$ at start of decay) is below the maximum intensity value $I_{max}$ corresponding to the saturation threshold value of the light sensor. Then, the offset current intensity $I_o$ is further checked, and possibly set (via the DAC (13)), so that the minimal value of the measured photocurrent intensity is very close to zero.
- in a subsequent step, a cycle of illumination with excitation light over excitation time $\Delta t_{ex}$ and acquisition of luminescence light intensity signal over measuring time interval $\Delta t_{meas}$ is performed to obtain (and store) digitalized luminescence light intensity profiles I(t) (typically, about one hundred), and a mean is calculated over said profiles which is in turn used for calculating a corresponding (test) decay time characteristic $\tau$.
- a final step of authentication is then performed by comparing the calculated value $\tau$ to a reference value $\tau_{ref}$ for the luminescent material: in case of (reasonable) matching, the marking including the luminescent material is considered as genuine, if not, the marking is considered as a fake. In this example, decay time values of about 100 to 120 μs can be measured. Other examples have been tested with successful measurement of decay time values of about 30 μs.

The above disclosed subject matter is to be considered illustrative, and not restrictive, and serves to provide a better understanding of the invention defined by the independent claims.

The invention claimed is:

1. A light sensor for detecting luminescence light received from a luminescent material, comprising:
   a bias regulator operable to deliver a bias voltage $V_b$;
   a photodiode having a cathode connected to the bias regulator so that the photodiode is reversely biased by the delivered bias voltage $V_b$, the photodiode being operable to deliver, in a photoconductive mode, a photocurrent intensity $I_p$ in response to received luminescence light in a given photodiode spectral range;
   an inverting transimpedance amplifier including an operational amplifier with a feedback resistor $R_f$ and a feedback capacitor $C_f$ mounted in parallel with the feedback resistor $R_f$ between an inverting input terminal and an output voltage terminal of the operational amplifier, the inverting input terminal of the operational amplifier being connected to an anode of the photodiode and operable to convert the delivered photocurrent intensity $I_p$ into an output voltage signal $V_{out}$ at the output voltage terminal;
   further comprising
   a PNP bipolar junction transistor of which emitter E and base B are connected in parallel with said feedback resistor $R_f$ and feedback capacitor $C_f$, with its base B connected to said output voltage terminal and its collector C grounded.

2. The light sensor according to claim 1, wherein the bias regulator is a low noise, fast transient response bias regulator.

3. The light sensor according to claim 1, further comprising capacitors $C_1$ and $C_2$ in series connected to the cathode of the photodiode and grounded, a grounded resistor $R_g$ being connected to a non-inverting input terminal of the operational amplifier and a terminal between the capacitors $C_1$ and $C_2$, adapted to eliminate voltage variations caused by the bias regulator.

4. The light sensor according to claim 1, further comprising a bias current sensor connected between an output voltage terminal of the bias regulator and the cathode of the photodiode operable to measure an intensity of the bias current $I_{bias}$ delivered to the photodiode.

5. A scanner for detecting luminescence light from a luminescent material upon illumination with an excitation light within an excitation wavelength range, said luminescent material emitting said luminescence light within an emission wavelength range, comprising:
   a power source operable to deliver variable drive current or drive voltage; and
   a light source connected to said power source and operable to illuminate said luminescent material with said excitation light within said excitation wavelength range when powered with the drive current or the drive voltage delivered by the power source, during an excitation time interval $\Delta t_{ex}$, said light source being operable to produce said excitation light with an excitation light intensity varying according to the delivered drive current or drive voltage, further comprising a light sensor according to claim 4 operable to deliver the output voltage signal $V_{out}$ to an input terminal of an analog-to-digital signal converter connected to the output voltage terminal upon illumination of said luminescent material with said light source and detection of corresponding emitted luminescence light, the analog-to-digital signal converter being operable to convert the output voltage signal $V_{out}$ into a digitalized luminescence light intensity signal over a measuring time interval $\Delta t_{meas}$; and a control unit connected to the bias current sensor to receive a measured value of the intensity of the bias current $I_{bias}$ and further connected to a control bus, the control unit being operable to control the power source via a first digital-to-analog signal converter connected between the power source and the control bus by setting a value of the drive current or drive voltage and a value of the excitation time interval $\Delta t_{ex}$, and the light sensor via both the analog-to-digital signal converter, further connected to the control bus, and a second digital-to-analog signal converter, connected to an offset resistor $R_o$ connected to the anode of the photodiode and further connected to the control bus to convert an offset current intensity $I_o$ into a digitalized offset current intensity, to set a value of the measuring time interval $\Delta t_{meas}$ and acquire the luminescence light intensity signal over the value of the measuring time interval $\Delta t_{meas}$ to form a digitalized luminescence light intensity signal profile I(t), wherein said control unit is further operable to receive said luminescence light intensity signal and control said power source to adapt the value of the drive current, or the value of the drive voltage, delivered to the light source so that a luminescence light intensity value corresponding to a delivered luminescence light intensity signal is below a maximum intensity value $I_{max}$ corresponding to a saturation threshold value of the photodiode.

6. The scanner according to claim 5, wherein the control unit, based on the measured value of intensity of the bias current $I_{bias}$, is further operable to adapt the value of the drive current, or the value of the drive voltage, delivered to the light source so that a level of the corresponding current intensity in the photodiode is below a photodiode current intensity threshold value and the level of the corresponding current intensity through the PNP bipolar junction transistor is below a transistor current intensity threshold value.

7. The scanner according to claim 5, wherein the control unit, based on the measured value of intensity of the bias current $I_{bias}$, a received value of the digitalized offset current intensity $I_o$, and a received value of the digitalized luminescence light intensity signal, is further operable to set a value of the delivered offset current intensity $I_o$ via the second digital-to-analog signal converter.

8. The scanner according to claim 7, wherein the control unit is operable to switch off the light source and then acquire digitalized luminescence light intensity signal and set a value of the offset current so as to make the acquired digitalized luminescence light intensity signal close to zero, thereby compensating a current intensity due to stray light.

9. The scanner according to claim 8, wherein the control unit is further operable to power the light source and then form a digitalized luminescence light intensity signal profile I(t), check if a value of a digitalized luminescence light intensity signal acquired after the measuring time interval $\Delta t_{meas}$ is close to zero, and, in case said checked value is not close to zero, further set a value of the offset current to make a value of a digitalized luminescence light intensity signal further acquired after the measuring time interval $\Delta t_{meas}$ close to zero, and then control the scanner to illuminate the luminescent material during the excitation time interval $\Delta t_{ex}$, acquire at least one corresponding digitalized luminescence light intensity signal profile I(t) over the measuring time interval $\Delta t_{meas}$ and store in a memory each acquired digitalized luminescence light intensity signal profile.

10. The scanner according to claim 9, wherein the control unit is further operable to determine a value of a decay time of the luminescent material from a stored digitalized luminescence light intensity signal profile.

11. The scanner according to claim 10, wherein the control unit is further operable to decide that the luminescent material is genuine in case the determined decay time value matches a reference value of decay time.

12. The scanner according to claim 5, wherein the illumination light source comprises a flat LED, the photodiode is a flat photodiode and said flat LED and flat photodiode are mounted adjacent and wired on a flat support member of a nose piece of the scanner for illuminating the luminescent material and collecting corresponding luminescence light, thereby allowing the nose piece to be disposed close to the luminescent material to improve illumination and luminescence light collection efficiency without necessitating a light guide.

13. The scanner according to claim 12, wherein the illumination light source comprises a plurality of flat LEDs wired in series on the support member, and a plurality of flat photodiodes wired in parallel on the support member.

* * * * *